(12) United States Patent
Tan et al.

(10) Patent No.: US 7,996,743 B1
(45) Date of Patent: Aug. 9, 2011

(54) LOGIC CIRCUIT TESTING WITH REDUCED OVERHEAD

(75) Inventors: Tze Sin Tan, Penang (MY); Jayabrata Ghosh Dastidar, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 301 days.

(21) Appl. No.: 12/060,805

(22) Filed: Apr. 1, 2008

(51) Int. Cl.
*G01R 31/28* (2006.01)
*G01R 31/00* (2006.01)
*G06F 11/00* (2006.01)
*G04F 1/00* (2006.01)

(52) U.S. Cl. ........ 714/745; 714/731; 714/733; 714/742; 714/744; 702/117; 702/125; 702/176

(58) Field of Classification Search .................. 714/745, 714/731, 733, 742, 744; 702/117, 125, 176
See application file for complete search history.

(56) References Cited

U.S. PATENT DOCUMENTS

| | | | | |
|---|---|---|---|---|
| 5,018,170 A * | 5/1991 | Wilson | ........................ | 375/376 |
| 5,455,931 A * | 10/1995 | Camporese et al. | .......... | 713/501 |
| 5,668,817 A | 9/1997 | Adham | | |
| 5,960,009 A | 9/1999 | Gizopoulos et al. | | |
| 6,163,865 A | 12/2000 | Kempsey | | |
| 6,385,125 B1 * | 5/2002 | Ooishi et al. | ............... | 365/233.1 |
| 6,674,332 B1 * | 1/2004 | Wunner et al. | .................. | 331/18 |
| 6,918,049 B2 * | 7/2005 | Lamb et al. | .................... | 713/500 |
| 6,944,780 B1 * | 9/2005 | Kranzen et al. | ............... | 713/300 |
| 7,043,655 B2 * | 5/2006 | Wu | ................................. | 713/501 |
| 7,157,942 B2 * | 1/2007 | Meltzer | ............................ | 327/3 |
| 7,260,758 B1 | 8/2007 | Agrawal et al. | | |
| 7,276,952 B2 * | 10/2007 | Desai et al. | .................... | 327/291 |
| 7,493,226 B2 * | 2/2009 | Robertson et al. | ............ | 702/106 |
| 7,514,970 B2 * | 4/2009 | Hassun | ........................ | 327/115 |
| 7,583,774 B2 * | 9/2009 | Lesso | ............................ | 375/377 |
| 2006/0001494 A1 * | 1/2006 | Garlepp et al. | .................... | 331/2 |
| 2007/0066268 A1 * | 3/2007 | Simic et al. | .................... | 455/318 |
| 2008/0256381 A1 * | 10/2008 | Jacobowitz et al. | .......... | 713/501 |
| 2009/0119052 A1 * | 5/2009 | Robertson et al. | ............ | 702/106 |
| 2010/0039157 A1 * | 2/2010 | Kaeriyama et al. | ........... | 327/292 |

* cited by examiner

*Primary Examiner* — John J Tabone, Jr.
(74) *Attorney, Agent, or Firm* — Treyz Law Group; G. Victor Treyz; David C. Kellogg

(57) ABSTRACT

An integrated circuit may have a circuit under test. The integrated circuit may have a clock generation circuit that receives a reference clock from a tester and that generates a corresponding core clock. The integrated circuit may have a built in self test circuit and a clock synthesizer that receives the core clock. The built in self test circuit may provide clock synthesizer control signals that direct the clock synthesizer to produce test clock signals at various test clock frequencies. The test clock at the test clock frequencies may be applied to the circuit under test during circuit testing. The circuit under test may assert a pass signal when the circuit tests are completed successfully. The built in self test circuit may inform the tester of the maximum clock frequency at which the circuit under test successfully passes testing.

21 Claims, 8 Drawing Sheets

US 7,996,743 B1

LOGIC CIRCUIT TESTING WITH REDUCED OVERHEAD

BACKGROUND

This invention relates to testing, and more particularly, to rapid testing techniques for integrated circuits.

Integrated circuits are generally tested before being sold. Testing can reveal memory faults that arise during device manufacturing. For example, testing may reveal that a particular memory array cell is stuck at a logical one value or that it is impossible to read data from a particular memory array cell. Testing may also reveal faults in other logic circuits. Identifying errors such as these allows integrated circuits to be repaired or discarded as appropriate.

To thoroughly exercise a circuit under test, it is often desirable to perform circuit tests over a range of clock speeds. For example, it may be desirable to test a circuit at ten different clock speeds. By testing the circuit at a variety of clock speeds, more accurate test results may be obtained. For example, it may be possible to precisely identify the maximum clock speed at which certain circuit functions operate. This may help a manufacturer identify which circuits should be discarded or repaired. Circuits may also be categorized by their maximum clock speed, which allows parts to be binned.

Conventional circuit testing arrangements allocate a fixed amount of test time for each clock speed test iteration. Test iterations that are associated with relatively faster clocks tend to take less time to complete than test iterations that are associated with relatively slower clocks. As a result, there can be a nonnegligible amount of overhead time associated with performing a test when a fixed amount of test time is allocated for each test iteration regardless of the clock speed associated with that iteration.

It would therefore be desirable to be able to provide improved arrangements for performing circuit testing at multiple clock speeds.

SUMMARY

In accordance with the present invention integrated circuits are provided that may be tested. In a typical scenario, a tester supplies a reference clock signal. An integrated circuit that is to be tested includes a circuit under test. The integrated circuit may contain a clock generation circuit that receives the reference clock from the tester and that generates a corresponding core clock.

The integrated circuit may include a built in self test circuit and a clock synthesizer. The built in self test circuit and the clock synthesizer may receive the core clock from the clock generation circuit. The built in self test circuit may generate clock synthesizer control signals that direct the clock synthesizer to produce a test clock at various different frequencies. The test clock may be applied to a circuit under test on the integrated circuit during testing.

The circuit under test may assert a pass signal when a circuit test at a particular test clock frequency is passed. The pass signal may be deasserted when the circuit test fails.

The built in self test circuitry may monitor the pass signal and the test clock frequency. At the completion of circuit testing on the circuit under test, the built in self test circuitry may provide an external tester with information on the maximum frequency of the test clock at which the circuit under test passed circuit testing.

Further features of the invention, its nature and various advantages will be more apparent from the accompanying drawings and the following detailed description of the preferred embodiments.

DETAILED DESCRIPTION

The present invention relates to testing integrated circuits that have built in self test (BIST) circuitry with clock frequency synthesis capabilities. The circuits that are tested may be memory arrays, logic circuits, or any other suitable circuitry on an integrated circuit.

The integrated circuits in which the built in self test circuitry is contained may be any suitable integrated circuits such as application specific integrated circuits, electrically programmable and mask-programmable programmable logic device integrated circuits, digital signal processors, microprocessors, microcontrollers, and memory chips. If desired, the testing circuitry of the present invention may be used in programmable integrated circuits that are not traditionally referred to as programmable logic devices such as microprocessors containing programmable logic, digital signal processors containing programmable logic, custom integrated circuits containing regions of programmable logic, or other programmable integrated circuits that contain programmable logic.

The present invention is sometimes described herein in connection with the testing of circuits on programmable circuits such as programmable logic device integrated circuits. This is, however, merely illustrative. Built in self test circuitry in accordance with embodiments of the present invention may be used to test circuitry on any suitable integrated circuit.

Figure 1:
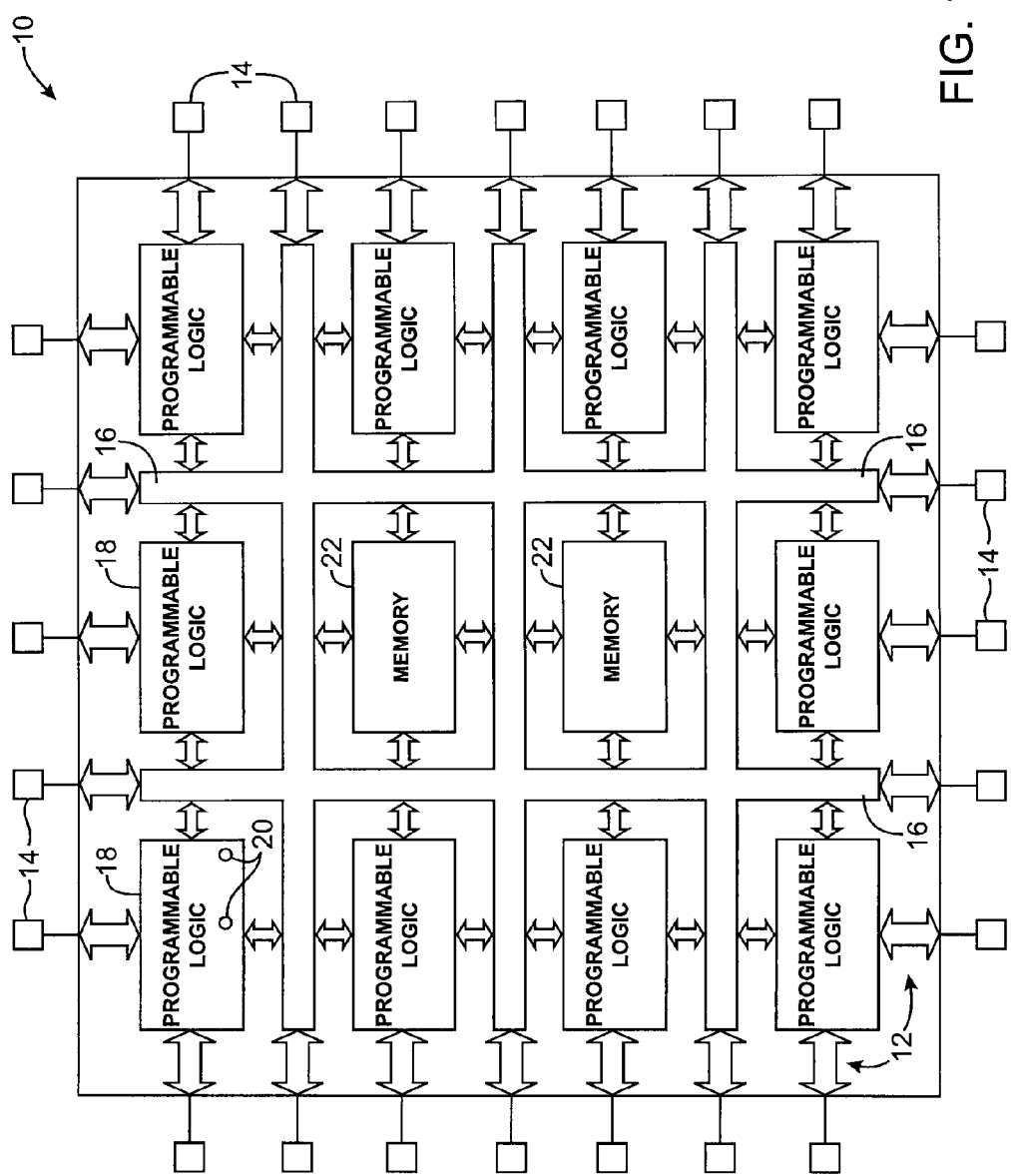
FIG. 1 is a diagram of an illustrative integrated circuit such as a programmable integrated circuit that may be tested using test equipment that handles multiple clock frequencies in accordance with an embodiment of the present invention.

An illustrative integrated circuit of the type that may contain testing circuitry in accordance with the present invention is shown in FIG. 1. As shown in FIG. 1, integrated circuit 10 (e.g., a programmable logic device integrated circuit) may have input/output circuitry 12 for driving signals off of device 10 and for receiving signals from other devices via input/output pins 14. Interconnection resources 16 such as global and local vertical and horizontal conductive lines and busses may be used to route signals on device 10. Interconnection resources 16 include conductive lines and programmable connections between respective conductive lines and are therefore sometimes referred to as programmable interconnects 16.

Programmable logic device 10 may contain programmable logic 18 and memory blocks 22.

Programmable logic 18 may include combinational and sequential logic circuitry. The programmable logic 18 may be configured to perform a custom logic function. The programmable interconnects 16 may be considered to be a type of programmable logic 18.

Programmable logic device 10 of FIG. 1 contains programmable memory elements 20. Memory elements 20 can be loaded with configuration data (also called programming data) using pins 14 and input/output circuitry 12. Once loaded, the memory elements may each provide a corresponding static control output signal that controls the state of an associated logic component in programmable logic 18. Memory elements 20 may use any suitable volatile and/or non-volatile memory structures such as random-access-memory (RAM) cells, fuses, antifuses, programmable read-only-memory memory cells, mask-programmed and laser-programmed structures, etc. Because memory elements 20 are loaded with configuration data during programming, memory elements 20 are sometimes referred to as configuration memory or configuration RAM. Mask-programmed programmable logic devices, which are sometimes referred to as structured application specific integrated circuits, are programmed by using lithographic masks to create a custom pattern of connections in an array of vias based on configuration data.

Memory arrays 22 contain rows and columns of volatile memory elements such as random-access-memory (RAM) cells. The memory arrays 22 can be used to store data signals during normal operation of device 10. The memory arrays 22 need not all be the same size. For example, small, medium, and large memory arrays 22 may be included on the same programmable logic device. There may, for example, be hundreds of small memory arrays each having a capacity of about 512 bits, 2-9 large memory arrays each having a capacity of about half of a megabit, and an intermediate number of medium size memory arrays each having a capacity of about 4 kilobits. These are merely illustrative memory array sizes and quantities. In general, there may be any suitable size and number of memory arrays 22 on device 10. There may also be any suitable number of regions of programmable logic 18.

During normal use in a system, memory elements 20 are generally loaded with configuration data from a configuration device integrated circuit via pins 14 and input/output circuitry 12. The outputs of the loaded memory elements 20 are applied to the gates of metal-oxide-semiconductor transistors in programmable logic 18 to turn certain transistors on or off and thereby configure the logic in programmable logic 18. Programmable logic circuit elements that may be controlled in this way include pass transistors, parts of multiplexers (e.g., multiplexers used for forming routing paths in programmable interconnects 16), look-up tables, logic arrays, AND, OR, NAND, and NOR logic gates, etc.

During testing, configuration data is generally loaded into memory elements 20 from a tester. Testers are typically based on dedicated test equipment. The test equipment may, for example, include one or more computers or other suitable computing equipment on which test software has been implemented. Testers may be used to load configuration data into memory elements 20 and, during testing, may be used to apply test vectors to device 10 while measuring test results.

The circuitry of device 10 may be organized using any suitable architecture. As an example, the logic of programmable logic device 10 may be organized in a series of rows and columns of larger programmable logic regions each of which contains multiple smaller logic regions. The resources of device 10 such as programmable logic 18 and memory 22 may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

In accordance with embodiments of the present invention, integrated circuits such as programmable logic device 10 may include built in self test circuitry for testing memory arrays such as memory arrays 22 of FIG. 1. The built in self test circuitry may include clock synthesizer circuitry that allows test clocks of varying frequencies to be generated on the integrated circuit that is being tested. The generation of the test clocks may be controlled by an external tester. The built in self test circuitry may supply the tester with test results. For example, the built in self test circuitry may supply the tester with information on the maximum clock frequency that was successfully used during testing. This information may be used by the tester in analyzing the performance of the integrated circuit. If desired, the integrated circuit can be repaired or discarded based on the test results. For example, on a programmable logic device in which a defective circuit is identified, fuses or other nonvolatile memory elements can be programmed to switch redundant circuitry into use in place of the defective circuit, thereby repairing the integrated circuit. The integrated circuit may also be categorized based on the test results. For example, using a binning scheme, the integrated circuit can be categorized based on the maximum clock frequency at which the integrated circuit operated properly during testing.

Testing may be performed when troubleshooting a new design or during manufacturing. The ability to perform detailed tests on circuitry such as programmable logic device circuits can be particularly helpful during early phases of product development. Detailed tests that include maximum successful test clock frequency information can reveal design or process problems. By addressing these problems early during the development of a programmable logic device or other integrated circuit, the design of the device can be improved to reduce process sensitivity or the manufacturing process can be tuned to enhance manufacturing yields.

The built in self test circuitry can be implemented using hardwired circuitry. If desired, some or all of the built in self test circuitry can be constructed from programmable logic (i.e., when the built in self test circuitry is being implemented on a programmable logic device). With arrangements of this type, in which the built in self test circuitry is sometimes referred to as configurable built in self test circuitry, the built in self test circuitry may be implemented as part of the testing process. For example, the configurable built in self test circuitry may be implemented by loading appropriate configuration data into programmable memory elements 20 on a given programmable logic device integrated circuit 10 in preparation for the subsequent loading of configuration data to configure a portion of the programmable logic device for testing. This type of built in self test circuitry, which is sometimes referred to as soft built in self test circuitry or a soft BIST, temporarily consumes programmable logic resources. After testing is complete, the programmable logic resources can be used to implement a desired logic design for a user (i.e., to implement user logic). Soft BIST arrangements can be advantageous when it is desired to minimize the amount of hardwired circuitry on the device 10 that is dedicated to implementing BIST functions. Hardwired BIST arrangements can be advantageous in situations in which it is desirable to avoid the programming time associated with configuring a soft BIST.

Figure 2:
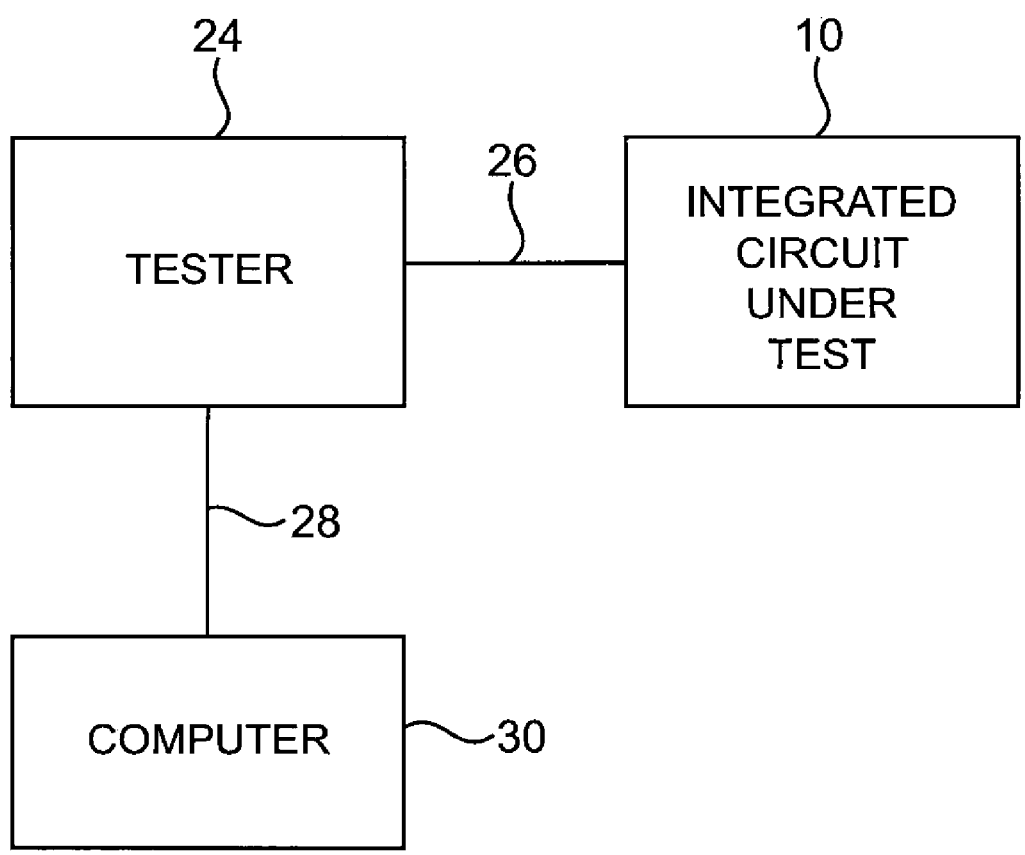
FIG. 2 is a diagram of an illustrative test environment in which integrated circuit tests at multiple clock frequencies may be performed using built in self test circuitry in accordance with an embodiment of the present invention.

A system environment of the type that may be used during test operations is shown in FIG. 2. A programmable logic device integrated circuit 10 or other integrated circuit under test may be connected to a tester 24 using test path 26. The device being tested, which is sometimes referred to as the device under test, may be an unpackaged integrated circuit such as a circuit in an undiced wafer or may be a packaged integrated circuit. Tester 24 may have an appropriate test fixture for making electrical connections with the pins 14 of device 10 during testing.

To perform a circuit test, an operator of the system of FIG. 2 may define a desired test to be performed by the built in self test circuitry by providing suitable test control data to computer 30. Testing software on computer 30 may accept this input and may provide corresponding test control data to tester 24 over path 28.

Tester 24 may apply power to device 10 through power pins. Based on the received test control data, tester 24 may provide suitable test control settings to built in self test circuitry on device 10 over path 26. Built in self test circuitry on device 10 may have circuitry for performing various tests based on the loaded test control settings. The circuitry that is being tested on integrated circuit 10 may sometimes be referred to as a circuit under test (CUT).

As tests are performed, test data may be generated on device 10. Device 10 may use internal circuitry to perform test analysis operations. Test analysis may also be performed externally. For example, test data can be provided to computer 30 or other diagnostic tools via path 26, tester 24, and path 28. Tester 24 and computer 30 are typically implemented using personal computers, workstations, mainframes, or other computers loaded with testing software.

The portion of a tester that is used to manage the execution of test programs is typically referred to as the tester "shell." A tester shell, which may be implemented using a scripting language program, typically performs operating-system-type commands during test operations. For example, a tester shell may load and run a test program on the tester. This type of arrangement may be used to perform tests over a range of different clock frequencies. Information on the maximum clock frequency at which a circuit can operate and other test results may be obtained by testing a device at more than one clock frequency in this way.

Figure 3:
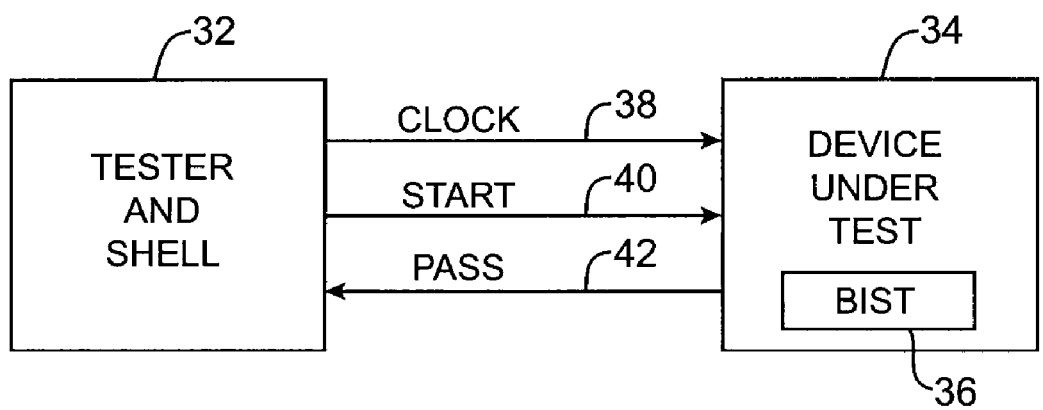
FIG. 3 is a diagram of a conventional test setup of the type that is used in testing integrated circuits with built in self test circuitry at multiple clock frequencies.

A conventional testing arrangement in which a tester is used in performing tests on an integrated circuit at more than one clock frequency is shown in FIG. 3. As shown in FIG. 3, tester 32 may produce clock signals CLOCK. The clock signals may be generated internally using a clock source in tester 32. The clock signals may be provided to integrated circuit 34 (i.e., the device under test) over path 38. Tester may asynchronously generate a START control signal for initiating testing. A control signal path 40 may be used to convey the START command from tester 32 to built in self test (BIST) circuit 36. When built in self test circuit 36 has successfully completed testing at a particular clock frequency, built in self test circuitry 36 may assert a PASS signal on path 42 to inform tester 32 of successful test completion at that frequency.

In arrangements of the type shown in FIG. 3, there is unavoidable overhead associated with performing test iterations at different clock frequencies. One source of test overhead is the test wait time that is associated with each test iteration. This wait time results from the need to allocate a fixed amount of test time for each test iteration, regardless of the test clock frequency that is associated with that test iteration.

Figure 4:
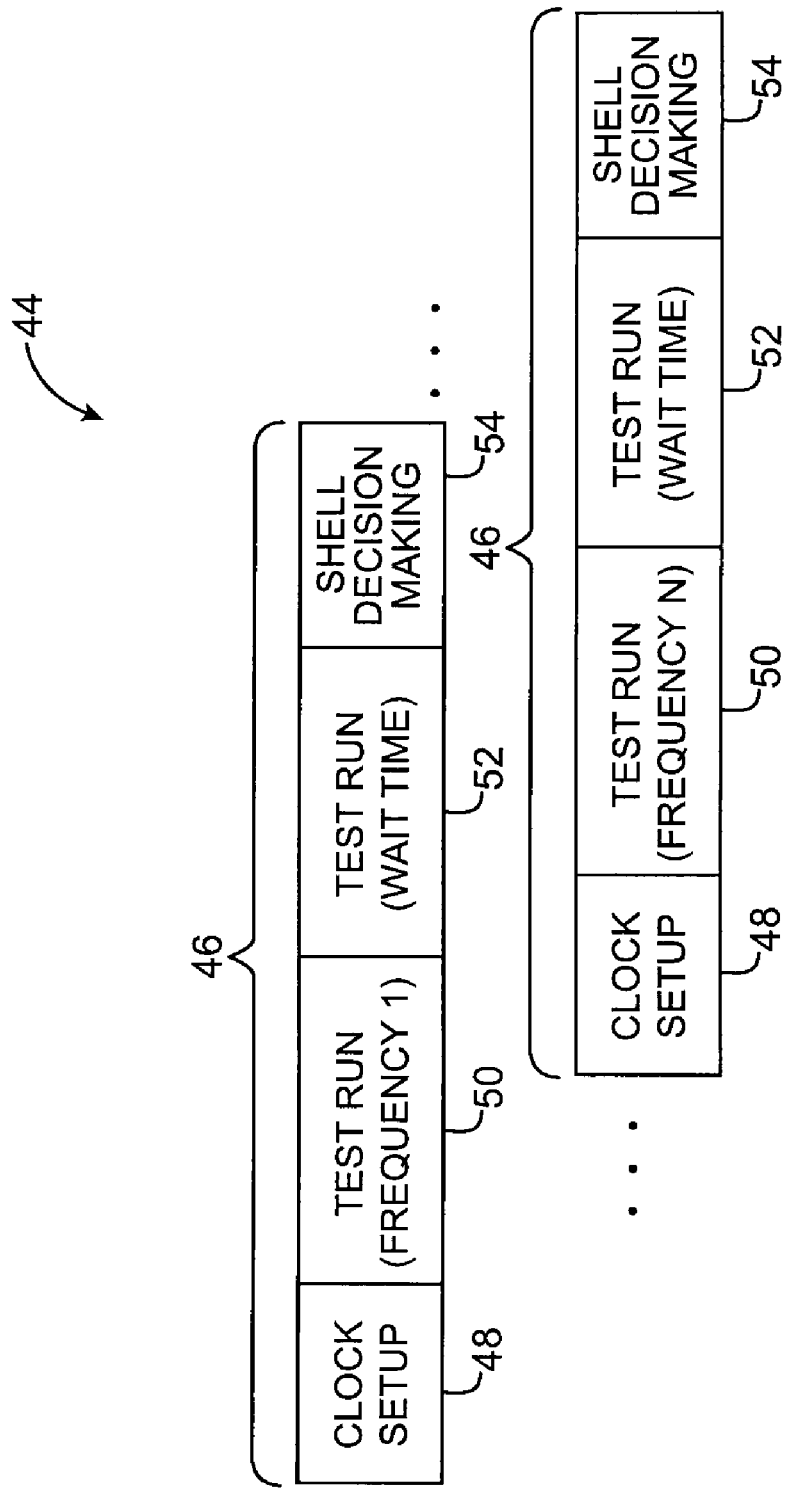
FIG. 4 is a diagram showing how much time is consumed by various components of a test during conventional testing of integrated circuits at multiple clock frequencies.

Contributions to the total test time of a conventional test having multiple test iterations each at a different test clock frequency are shown in FIG. 4. As shown in FIG. 4, test 44 may include a number of test iterations 46. Each test iteration 46 may have a number of associated phases.

Each test iteration has a clock setup phase 48 that lasts about 100 microseconds to a few milliseconds. During clock setup, tester 32 applies clock signals CLOCK to the device under test 34 over path 38 and asynchronously applies the START signal on path 40. Tester 32 cannot generate the CLOCK and START signals at the same time, because these signals are not synchronized to a common clock. Clock setup phase 48 is required to allow the clock circuitry in tester 32 (e.g., phase-locked loop circuitry) to prepare the specified CLOCK rate before driving it out to device under test 34.

During each test run phase 50, testing is performed on circuitry in device under test 34 using built in self test circuit 36. Each test run may be completed using a different clock frequency. For example, during the first test iteration 46, a test run may be performed at a clock frequency of 10 MHz (as an example), whereas during a second test iteration 46, a test run may be performed at a clock frequency of 20 MHz. A typical test run may require about 2-100,000 clock cycles to complete. The test time associated with a given test run depends on both the number of clock cycles that are used for the test and the clock frequency. As an example, a test involving $10^5$ clock cycles at 10 MHz will generally require at least 10 ms to complete.

There is a test wait time 52 associated with each test iteration. The test wait time is generally lowest for low-clock-frequency test runs and largest for high-clock-frequency test runs, because a fixed block of time is allocated for each test iteration.

A shell decision making phase 54 follows each test run wait time phase 52. During shell decision making, the shell on tester 32 analyzes the PASS signals that were received on path 42 during testing to determine whether device under test 34 has failed or passed testing and decides on the next iteration test frequency. Each shell decision making phase 54 typically takes between 10 to 20 microseconds, depending on the hardware capabilities of tester 32.

Figure 5:
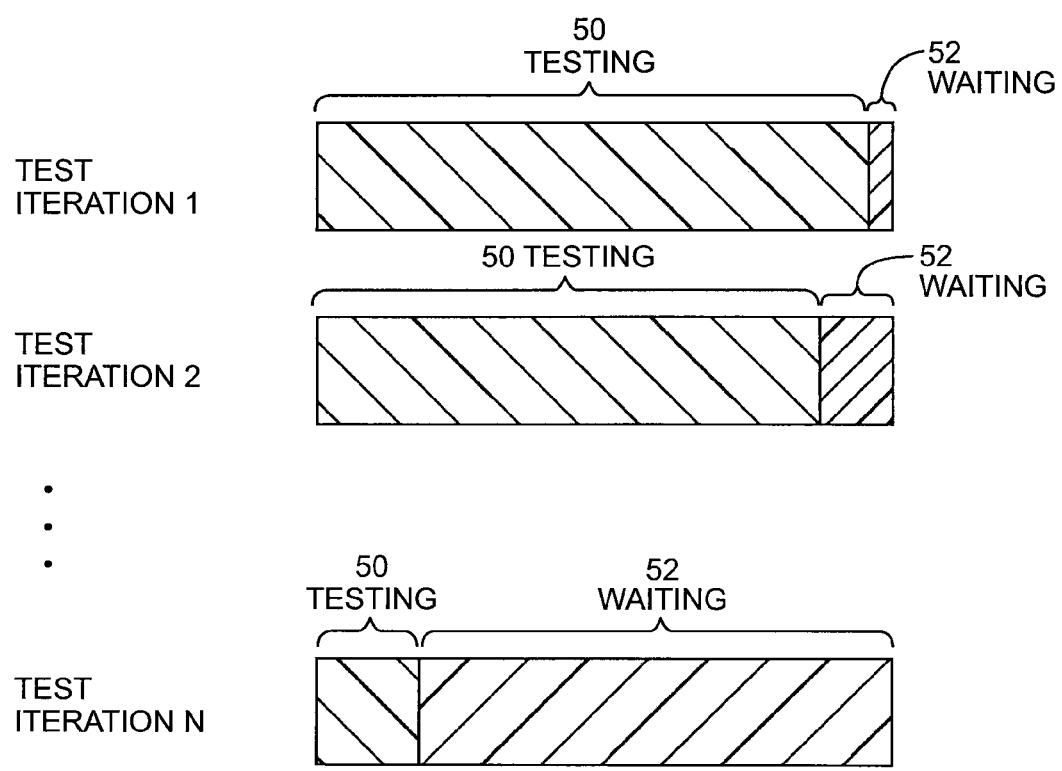
FIG. 5 is a diagram showing how the test run wait time that is associated with each test iteration in a conventional test at multiple clock frequencies may contribute significantly to the overall test time associated with testing an integrated circuit.

As a consequence of the fixed test time that is allocated for each test iteration with conventional testing arrangements of the type associated with FIG. 4, relatively large amounts of test time are consumed by the test wait phases 52 that are associated with test iterations at higher clock frequencies. This effect is illustrated in FIG. 5. In the example of FIG. 5, tester 32 is testing a device 34 using N test iterations. During each test iteration, tester 32 generates a CLOCK signal for device 34 at a different frequency. In the FIG. 5 example, test iteration 1 has the slowest associated test clock frequency, test iteration 2 has the second slowest associated test clock frequency, etc.

Because a different and increasing clock frequency is associated with each successive clock iteration in the FIG. 5 example, the amount of time consumed by testing decreases with each successive test iteration. This is because the test time for each iteration scales inversely with the clock frequency for that test iteration. As described in connection with FIG. 4, conventional testing schemes allocate a fixed amount of test time for each test iteration, regardless of the clock frequency associated with that test iteration. This results in large test wait times, particularly for test iterations associated with the faster clocks. In test iterations such as these (e.g., test iteration N of FIG. 5), the amount of time associated with testing is relatively small compared with the amount of the allocated test time that is associated with test wait period 52.

As an example, the total test time per iteration might be about 10 ms. During the first test iteration, testing may consume 9 ms, so the test wait time would be 1 ms. During a second test iteration, testing may consume 8 ms and waiting may consume 2 ms. Near the end of the test, there may be as little as 1 ms of testing and as much as 9 ms of waiting.

Because the amount of time consumed during testing is equal to the total of the individual test iteration times, conventional schemes of the type shown in FIG. 5 tend to use time inefficiently. Even though tests at higher clock frequencies are completed more quickly, the allocation of a fixed amount of test time per test iteration does not reduce the time associated with test iterations at higher clock frequencies. In tests that involve many test iterations, the wasted time that is associated with waiting for the fixed test iteration times to expire can be considerable.

In accordance with embodiments of the present invention, testing may be performed using on-chip test clock generation circuitry. The on-chip clock generation circuitry may allow tests to be performed efficiently at multiple test clock frequencies.

Figure 6:
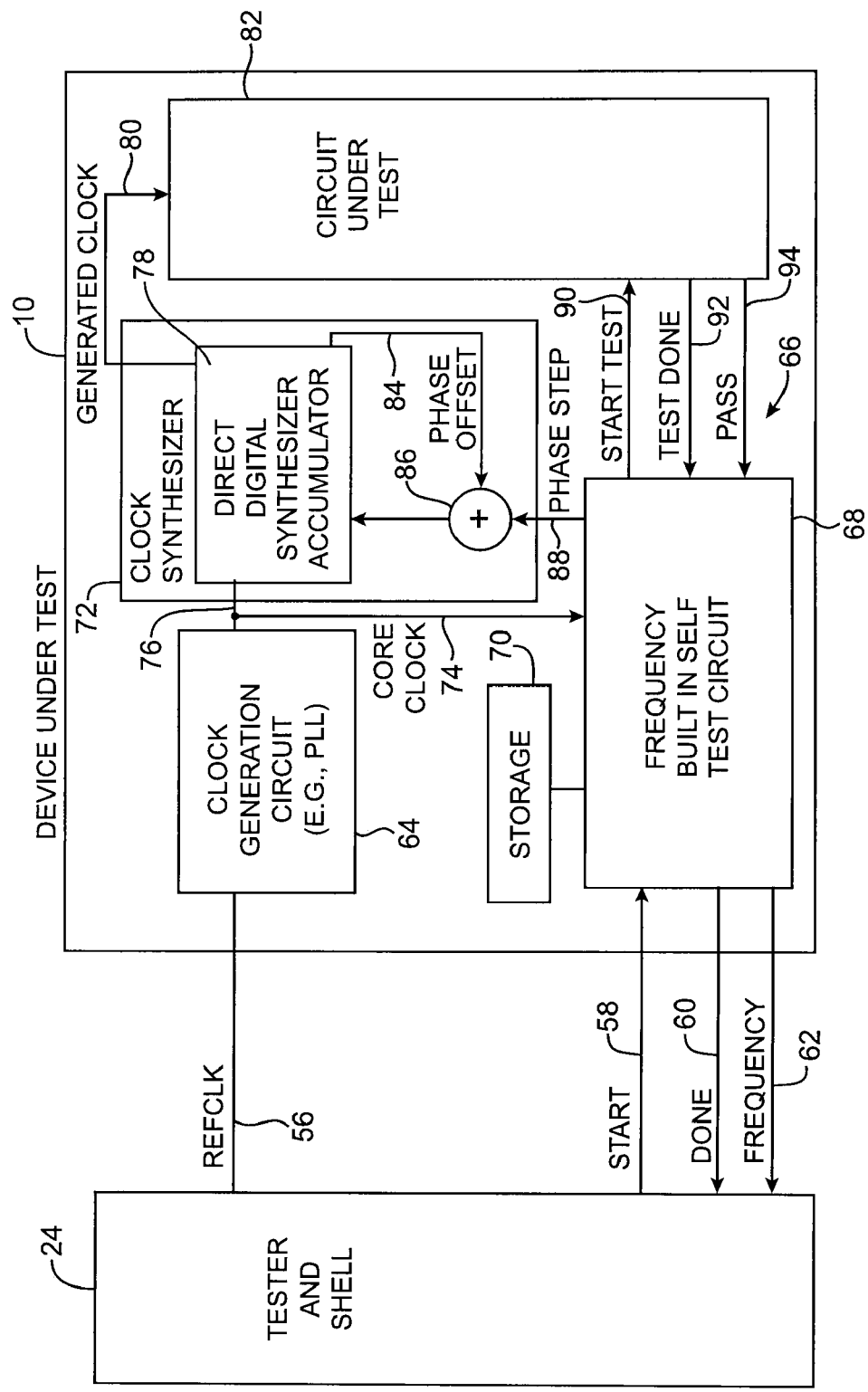
FIG. 6 is a diagram showing test equipment and an integrated circuit being tested using built in self test circuitry at multiple test clock frequencies in accordance with an embodiment of the present invention.

An illustrative test arrangement in accordance with an embodiment of the present invention is shown in FIG. 6. As shown in FIG. 6, tester 24 may be used to perform tests on an integrated circuit 10. Circuit 10, which is sometimes referred to as the device under test (DUT) may be a programmable logic device integrated circuit or any other suitable integrated circuit. Before tests are performed, tester 24 may load test configuration data into programmable logic 18 on device 10 to configure device 10 to implement desired circuits for testing (e.g., all or part of circuit under test 82).

Tester 24 may supply a reference clock REFCLK to device 10 over path 56. Signal REFCLK may have any suitable frequency. Examples of suitable REFCLK frequencies are 50 MHz and 100 MHz. If desired, other clock frequencies may be used for REFCLK. Frequencies of 50 MHz and 100 MHz are merely illustrative. The frequency of reference clock REFCLK is generally fixed.

Path 58 may be used by tester 24 to supply a START control signal to built in self test circuitry 66 on device 10. Built in self test circuitry 66 may generate a DONE signal on path 60 when testing is complete. Built in self test circuitry 66 may provide a FREQUENCY signal to tester 24 over a path such as path 62 following testing. The FREQUENCY signal may inform tester 24 of the maximum clock signal at which the circuitry 82 of device 10 performed satisfactorily during testing.

Built in self test circuitry 66 may include control circuit 68 (sometimes referred to as a built in self test circuit or frequency built in self test circuit). Storage 70 may be used to store information such as information on a maximum clock cycle count permitted during testing. Built in self test circuitry 66 may also include a clock synthesizer 72. Clock synthesizer 72 is on-chip circuitry that may be used to generate a clock signal (called GENERATED CLOCK) for testing circuit under test 82. Circuit under test 82 may be any suitable circuitry (e.g., a logic circuit). As an example, circuit under test 82 may include a memory array. As another example, circuit under test 82 may include a number of logic elements or larger logic components such as logic array blocks. Interconnect paths and other circuitry may also be included in circuit under test 82.

Signal REFCLK may be received by clock generation circuit 64 from path 56. Clock generation circuit 64 may be based on a digital locked loop, a phase-locked loop, or any other suitable clock generation circuit. If desired, clock generation circuit 64 may be considered part of built in self test circuit 66. Clock generation circuit 64 may be implemented using hardwired circuitry such as hardwired phase-locked loop circuitry on device 10 and/or programmable logic (as an example).

In a typical scenario, tester 24 uses an internal clock source or an external source to supply device under test 10 with a fixed-frequency reference clock signal REFCLK (e.g., at 50-100 MHz). Clock generation circuit 64 locks onto the REFCLK signal and produces a corresponding fixed-frequency CORE CLOCK signal. With one suitable arrangement, the CORE CLOCK signal has a frequency that might normally be associated with operating core logic circuitry in device 10 (e.g., 500 MHz as an example). The setup time associated with generating the REFCLK signal by tester 24 need only be incurred once per test, rather than once per test iteration, because clock signal generation tasks are handled internally using circuits such as clock synthesizer 72, rather than circuitry in tester 24.

As shown in FIG. 6, the signal CORE CLOCK may be provided to frequency built in self test circuit 68 using path 74 and may be routed to clock synthesizer circuitry 72 using path 76. Clock synthesizer circuitry 72 may receive the CORE CLOCK signal at the input to direct digital synthesizer accumulator 78 and may produce a corresponding output clock signal GENERATED CLOCK on path 80. Direct digital synthesizer accumulator 78 may produce a PHASE OFFSET signal on path 84. Adder circuit 86 may be used to add the PHASE OFFSET signal on path 84 and a PHASE STEP signal on path 88 that is received from frequency built in self test circuit 68.

Direct digital synthesizer accumulator 78 is an example of an adjustable clock generation circuit. The PHASE STEP signal that is provided to adder circuit 86 serves as a clock frequency control signal for the clock synthesizer. The signal PHASE STEP is a digital signal that serves as an increment value for a counter in direct digital synthesizer accumulator 78. Direct digital synthesizer accumulator 78 may operate as a binary adder and may include a register that holds its current value. If the value of PHASE STEP is large, the current value of accumulator 78 will tend to grow quickly. If the value of PHASE STEP is small, the current value of accumulator 78 will tend to grow more slowly.

As an example, the current value of accumulator 78 may be represented using eight bits. The most significant bit may be used as the GENERATED CLOCK signal on path 80. If CORE CLOCK has a frequency of 500 MHz, and PHASE STEP is equal to one, the most significant bit of the eight-bit accumulator word will toggle from 0 to 1 after 128 clock cycles and will toggle from 1 to 0 after another 128 clock cycles. As a result, the signal GENERATED CLOCK will be 256 times slower than CORE CLOCK (i.e., GENERATED CLOCK=CORE CLOCK/256). If, however, the value of PHASE STEP is four, the GENERATED CLOCK signal will be 32 times slower than the CORE CLOCK signal (i.e., GENERATED CLOCK=CORE CLOCK/32). As this example demonstrates, frequency built in self test circuit 68 can control the frequency of test clock GENERATED CLOCK on path 89 by adjusting the value of PHASE STEP that is supplied to clock synthesizer 72 over path 88. This can be accomplished in real time during each test iteration when testing circuit 82.

At the beginning of the first test iteration, frequency built in self test circuit 68 asserts the START TEST signal on path 90 and generates an initial PHASE STEP signal on path 88. When testing is complete, circuit under test 82 may generate a TEST DONE signal on path 92. If desired, built in self test circuit 68 may maintain a clock cycle count that can be used in determining when testing is complete. With this type of approach, circuit 68 may compare the clock cycle count to a maximum clock cycle count value that is maintained in storage 70 to determine whether test completion has been achieved. Circuit under test 82 may provide a signal PASS on path 94 that indicates whether circuit under test 82 has successfully passed a test at a given test clock frequency.

During testing, frequency built in self test circuit 68 may repeatedly generate clock adjustment control signals that direct clock synthesizer 72 to generate test clocks for circuit under test 82 at various frequencies. Any suitable pattern may be used when testing circuit 82 at different clock frequencies. For example, a range of clock frequencies may be tested starting at a relatively low clock frequency (e.g., 10 MHz) ranging up to a higher clock frequency (e.g., 500 MHz). As another example, a tree-type binary search pattern may be used in which the results of each test iteration (pass or fail) determine whether the next test clock frequency is higher or lower. By decreasing the size of the clock frequency step (e.g., by half each iteration), built in self test circuitry 66 can efficiently determine the maximum clock frequency at which circuit under test 82 can successfully perform its desired test operations. Information on the maximum successful clock frequency may be provided to tester 24 over path 62. Circuit 68 may then assert the DONE signal on path 60 to inform tester 24 of test completion.

The information on the maximum successful clock frequency (signal FREQUENCY on path 62) may be calculated by dividing CORE CLOCK on path 74 by a value PHASE STEP COUNT, where PHASE STEP COUNT is equal to a value MAX PHASE divided by the value of PHASE STEP on path 88. The value of MAX PHASE is equal to 2 raised to the power of the width of accumulator 78 (i.e., MAX PHASE=2^ACCUMULATOR WIDTH). Consider the following calculation as an example. At a CORE CLOCK of 500 MHz, an accumulator width of 8 bits, and a PHASE STEP of 1, ACCUMULATOR WIDTH will be equal to 8, making MAX PHASE equal to 2^8=256. The value of PHASE STEP COUNT will be equal to 256/1=256. The value of FREQUENCY will therefore be 500 MHz/256=1.95 MHz.

Figure 7:
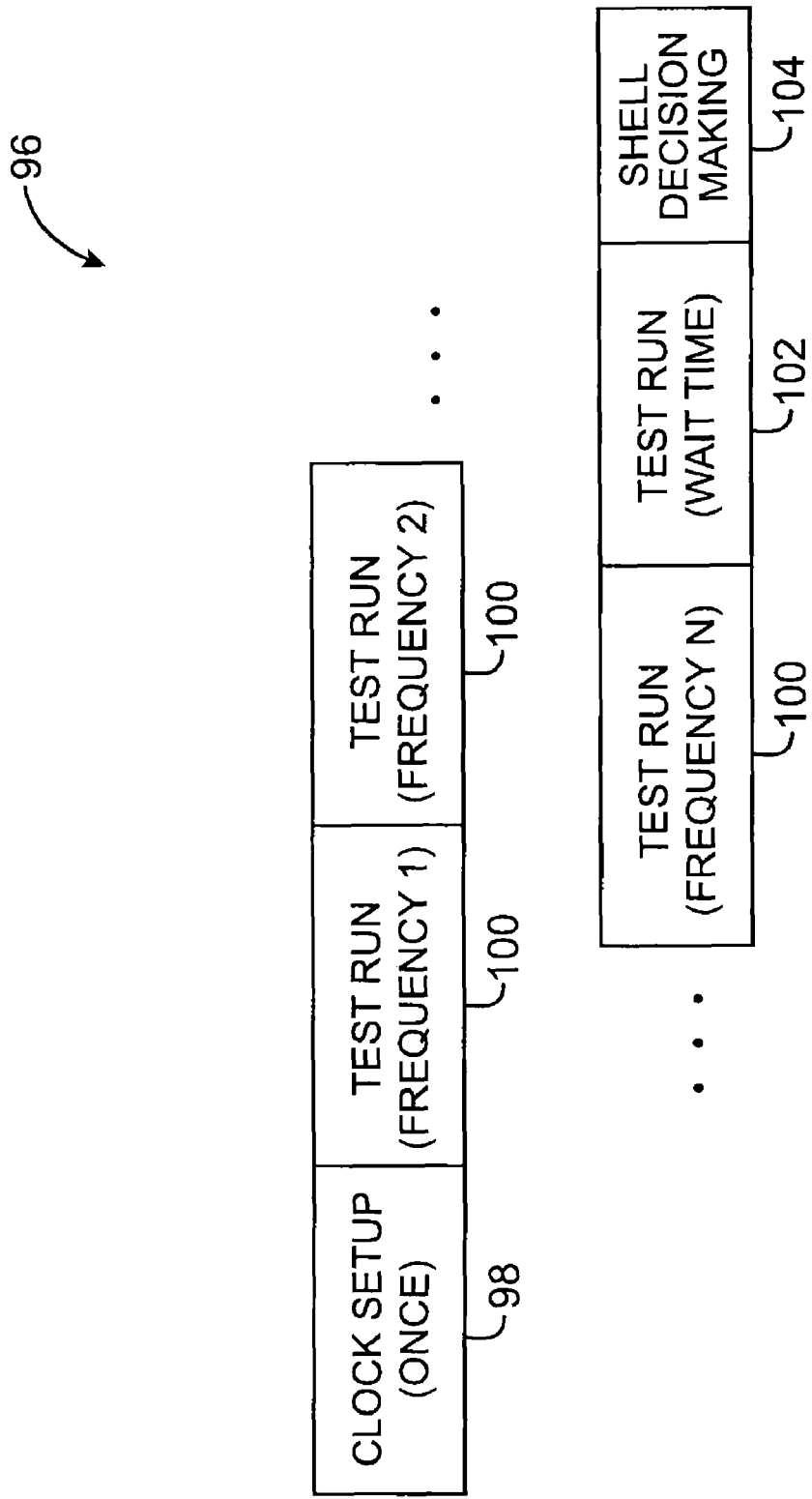
FIG. 7 is a diagram showing how overall test run wait time may be minimized when testing integrated circuits using multiple clock frequencies and on-chip circuitry having clock synthesis capabilities in accordance with the present invention.

As shown in FIG. 7, the amount of overhead associated with test run wait time can be reduced using a test arrangement of the type described in connection with FIG. 6. During test 96, test runs 100 may be performed on circuit 82 at various different clock frequencies by using built in self test circuitry 66 to generate on-chip test clocks. The REFCLK signal may be generated once by tester 24 without interruption. It is therefore only necessary to incur one clock setup time 98 during an entire circuit test 96. Clock setup time 98 allows time for the phase-locked loop or other such circuitry in clock generation circuit 64 to lock to the reference clock and settle to a valid state.

During each test iteration, a different clock adjustment signal (e.g., PHASE STEP) may be used to direct clock synthesizer 72 to produce a corresponding GENERATED CLOCK signal for circuit under test 82. Test iterations need not take any longer than necessary for completion of a desired number of test cycles. As a result, there is no test wait time associated with each test iteration. When the GENERATED CLOCK signal has a relatively low frequency, testing operations for a given test iteration tend to take longer, but when the GENERATED CLOCK signal has a relatively high frequency, the testing operations of a test iteration can be completed in a correspondingly shorter amount of time. As each test iteration is completed, a new PHASE STEP signal may be applied to clock synthesizer 72 for use during the next test iteration. Only a few clock cycles are generally needed to generate each successive PHASE STEP signal, so there is negligible overhead associated with each test iteration.

When all desired test iterations have been completed, testing may enter a test run wait time phase 102. During wait time 102, tester 24 may poll device 10 for the status of the DONE signal on path 60. Because there is only one wait time 102 for the entire test 96, rather than an overhead burden associated with each test iteration, the arrangement of FIG. 6 can exhibit reduced test times.

During shell decision making phase 104, the test program running on tester 24 obtains frequency information from built in self test circuit 68 (e.g., the FREQUENCY signal) and processes this information for evaluation by operators of the system.

Figure 8:
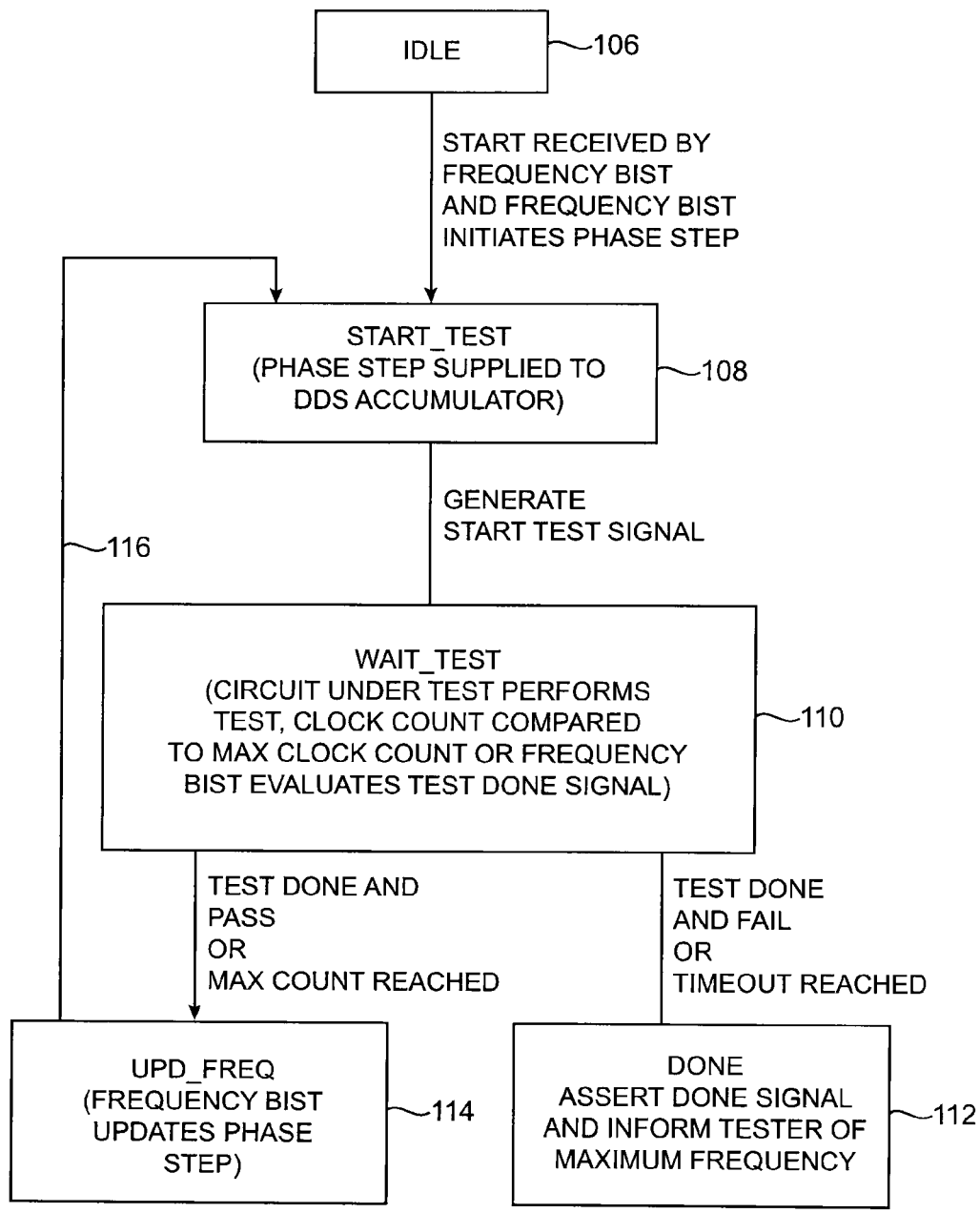
FIG. 8 is a diagram of illustrative steps involved in testing integrated circuits with multiple clock frequencies in accordance with an embodiment of the present invention.

A diagram showing illustrative steps involved in testing a device 10 with a tester 24 in a system environment of the type shown in FIG. 6 is shown in FIG. 8.

At step 106, frequency built in self test circuit 68 operates in an idle state. In the idle state, the frequency built in self test circuit 68 is reset to an initial condition.

A START signal may be used to trigger the built in self test circuit to begin testing. Tester 24 may generate the START signal. The START signal may be passed to frequency built in self test circuit 68 via path 58. When frequency built in self test circuit 68 receives the START signal, frequency built in self test circuit 68 may initiate the PHASE STEP signal (path 88).

At step 108, testing of circuit under test 82 may commence using an initial test frequency for the GENERATED CLOCK signal on path 80. During step 108, frequency built in self test circuit 68 supplies the PHASE STEP signal corresponding to the initial test clock frequency to clock synthesizer 72 (i.e., to adder circuit 86, which supplies its output to direct digital synthesizer accumulator 78).

Once the desired GENERATED CLOCK test clock signal is being supplied to circuit under test 82 over path 80 and circuit under test 82 is being tested, built in self test circuit 68 may await test completion (WAIT TEST state 110). During step 110, circuit under test 82 is used in performing an appropriate set of tests that test circuit under test 82. Testing may reach completion when a maximum clock count is reached or when circuit under test 82 asserts the TEST DONE signal on path 92.

With the maximum clock count arrangement, as circuit under test 82 performs test operations during step 110, frequency built in self test circuit 68 may maintain a count of test clock cycles (i.e., cycles of the GENERATED CLOCK signal). This test clock cycle count may be compared in real time to a maximum test clock cycle count that is stored in storage 70. If the clock cycle count reaches the maximum permitted clock cycle value, built in self test circuitry 68 can conclude that testing is complete.

With the TEST DONE signal arrangement, frequency built in self test circuit 68 may monitor the status of the TEST DONE signal on path 92. Frequency built in self test circuit 68 may detect when the signal TEST DONE is asserted by circuit under test 82 to indicate that testing is complete.

The results of the test performed on circuit under test 82 may be indicated using the PASS signal on path 94. If testing is successful, circuit under test 82 may assert the PASS signal (e.g., by taking PASS high). If testing fails (i.e., if an error is detected during testing at a particular clock frequency), circuit under test 82 may deassert the PASS signal (i.e., test failure may be indicated by taking PASS low).

As shown in FIG. 8, if testing is indicated to be complete through assertion of the TEST DONE signal and the test is indicate to have failed (as indicated by a deasserted PASS signal) or if a predetermined maximum test time limit ("timeout") has been reached, the testing process finishes at step 112. Frequency built in self test circuit 68 may therefore assert the DONE signal on path 60 to inform tester 24 that testing is complete. Frequency built in self test circuit 68 may also provide information on the maximum test clock frequency that was successfully used during testing (i.e., the maximum value of GENERATED CLOCK that resulted in a passed test of circuit under test 82) to tester 24. The maximum frequency information may be passed from frequency built in self test circuit 68 to tester 24 as frequency information signal FREQUENCY on path 62.

If testing is indicated to be complete through assertion of the TEST DONE signal or if frequency built in self test circuit 68 determines that the test clock count has reached the stored maximum test clock count in storage 70, a new test clock frequency may be generated, as indicated by state UPD FREQ (step 114). During step 114, frequency built in self test circuit 68 may update (e.g., increment) the value of PHASE STEP that is produced on path 88. This, in turn, may direct clock synthesizer 72 to generate an updated value of GENERATED CLOCK on path 80 for testing circuit under test 82. As indicated by line 116, after the operations of step 114 are complete, control may loop back to step 108 for additional testing of circuit under test 82.

The foregoing is merely illustrative of the principles of this invention and various modifications can be made by those skilled in the art without departing from the scope and spirit of the invention.

What is claimed is:

1. A method of testing an integrated circuit that contains a circuit under test, the method comprising:
    generating a test clock at a plurality of different frequencies using a clock synthesizer on the integrated circuit that contains the circuit under test, wherein generating the test clock comprises using a reference clock received from an external tester that is removably coupled to the integrated circuit; and
    applying the test clock to the circuit under test on the integrated circuit at the plurality of different frequencies during testing of the circuit under test to produce test information for the external tester.

2. The method defined in claim 1 wherein generating the test clock comprises generating the test clock with a direct digital synthesizer accumulator on the integrated circuit.

3. The method defined in claim 1 wherein generating the test clock comprises generating the test clock with a direct digital synthesizer accumulator on the integrated circuit in response to a phase step signal.

4. The method defined in claim 1 wherein the integrated circuit is operable to generate a plurality of different phase steps and wherein generating the test clock comprises generating the test clock with an accumulator on the integrated circuit in response to at least some of the phase steps of said plurality of different phase steps.

5. The method defined in claim 4 further comprising:
    asserting a signal with the circuit under test to indicate that testing of the circuit under test is complete.

6. The method defined in claim 4 further comprising:
    with the integrated circuit, determining that testing of the circuit under test is complete; and
    in response to the integrated circuit determining that testing of the circuit under test is complete, notifying the external tester of a given test clock frequency for which the circuit under test was successfully tested.

7. The method defined in claim 6 further comprising:
    with the circuit under test, asserting a first signal to indicate that testing of the circuit under test is complete; and
    with the circuit under test, asserting a second signal in response to determining that the circuit under test has passed testing.

8. The method defined in claim 1 further comprising:
    storing a given test clock cycle count in storage on the integrated circuit; and
    with the integrated circuit, determining that testing of the circuit under test is complete in response to a comparison of a test clock cycle count to the stored given test clock cycle count.

9. The method defined in claim 1 wherein generating the test clock comprises:
    applying at least some of a plurality of different phase step values in succession to a first input of an adder;
    with a direct digital synthesizer accumulator, receiving a first clock signal at a first input, receiving an output for the adder, generating a phase offset signal that is applied to a second input of the adder, and producing the test clock at different frequencies each of which corresponds to a respective one of the different phase step values.

10. The method defined in claim 1
    wherein generating the test clock comprises:
    with a clock generation circuit on the integrated circuit, receiving the reference clock and generating a corresponding core clock signal; and
    providing the core clock signal to an input of a direct digital synthesizer accumulator on the integrated circuit.

11. An integrated circuit that is tested using a test clock at a plurality of different test clock frequencies, the integrated circuit comprising:
    a clock synthesizer operable to generate the test clock at the plurality of different test clock frequencies using a reference clock received from an external tester that is removably coupled to the integrated circuit; and
    a circuit under test operable to receive the test clock for testing the circuit under test, wherein said circuit under test is operable to produce test information for the external tester.

12. The integrated circuit defined in claim 11 wherein the clock synthesizer comprises:
- an adder; and
- an accumulator operable to produce a phase offset signal for the adder, wherein the accumulator is further operable to generate the test clock at the plurality of different test clock frequencies.

13. The integrated circuit defined in claim 12 further comprising a clock generation circuit operable to receive the reference clock and operable to generate a corresponding clock signal, wherein the accumulator comprises a direct digital synthesizer accumulator and wherein the corresponding clock signal is supplied as an input to the direct digital synthesizer accumulator.

14. The integrated circuit defined in claim 11 further comprising a clock generation circuit operable to receive the reference clock and operable to generate a corresponding clock signal, wherein the corresponding clock signal is supplied as an input to the clock synthesizer.

15. The integrated circuit defined in claim 11 further comprising:
- storage operable to store a given test clock count value; and
- built in self test circuitry operable to maintain a current test clock count during testing of the circuit under test and operable to complete testing of the circuit under test when the current test clock count is determined to match the given test clock count value.

16. A system for performing circuit tests, the system comprising:
- a tester operable to generate a reference clock; and
- an integrated circuit device under test comprising:
  - a clock generation circuit operable to receive the reference clock and to generate a corresponding core clock;
  - a circuit under test; and
  - a clock synthesizer operable to use the core clock in generating a test clock at a plurality of different test clock frequencies, wherein the clock synthesizer is operable to apply the test clock to the circuit under test to test the circuit under test to produce test information for the tester, wherein the tester is an external tester that is removably connected to the integrated circuit device.

17. The system defined in claim 16 wherein the integrated circuit device under test further comprises a built in self test circuit operable to receive the core clock and operable to generate a plurality of different phase steps, wherein the clock synthesizer is operable to generate each of the test clock frequencies in response to receiving each of different phase steps.

18. The system defined in claim 17 wherein the clock synthesizer comprises:
- an adder operable to receive the plurality of different phase steps and a phase offset signal; and
- a direct digital synthesizer accumulator operable to produce the phase offset signal, operable to receive an output from the adder, operable to receive the core clock, and operable to produce the test clock at the plurality of different test clock frequencies, wherein each of the plurality of different phase steps corresponds to a different one of the different test clock frequencies.

19. The system defined in claim 16 further comprising a built in self test circuit operable to receive an asserted pass signal from the circuit under test when the circuit under test determines that the circuit under test passed circuit testing at a particular test clock frequency.

20. The system defined in claim 19 further comprising:
- a communications path between the built in self test circuit and the tester over which the built in self test circuit is operable to provide the tester with information on a maximum test clock frequency at which the circuit under test successfully passed the circuit testing;
- configuration random-access memory cells on the integrated circuit device; and
- programmable logic on the integrated circuit device under test that is configured using configuration data stored in the configuration random-access memory cells.

21. The system defined in claim 16 wherein the integrated circuit device under test further comprises:
- storage operable to store a given test clock count value; and
- built in self test circuitry operable to maintain a current test clock count during testing of the circuit under test and operable to complete testing of the circuit under test when the current test clock count is determined to match the given test clock count value.

* * * * *